United States Patent
Youn et al.

(10) Patent No.: US 10,840,471 B2
(45) Date of Patent: Nov. 17, 2020

(54) ORGANIC LIGHT EMITTING DIODE DISPLAY DEVICE HAVING COLOR CHANGING LAYER

(71) Applicant: LG DISPLAY CO., LTD., Seoul (KR)

(72) Inventors: Jun-Ho Youn, Seoul (KR); Heume-Il Baek, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/844,018

(22) Filed: Dec. 15, 2017

(65) Prior Publication Data

US 2018/0182990 A1 Jun. 28, 2018

(30) Foreign Application Priority Data

Dec. 28, 2016 (KR) .................. 10-2016-0181465

(51) Int. Cl.
*H01L 51/50* (2006.01)
*H01L 51/52* (2006.01)
*H01L 27/32* (2006.01)

(52) U.S. Cl.
CPC ........ *H01L 51/5044* (2013.01); *H01L 27/322* (2013.01); *H01L 51/5253* (2013.01); *H01L 51/5278* (2013.01); *H01L 51/5056* (2013.01); *H01L 51/5072* (2013.01); *H01L 51/5088* (2013.01); *H01L 51/5092* (2013.01); *H01L 51/5265* (2013.01)

(58) Field of Classification Search
CPC ......... H01L 51/5044; H01L 2251/5369; H01L 27/322
See application file for complete search history.

(56) References Cited

U.S. PATENT DOCUMENTS

| 6,608,439 B1 * | 8/2003 | Sokolik .................. B82Y 20/00 |
| | | 313/504 |
| 2006/0157728 A1 | 7/2006 | Iou |

(Continued)

FOREIGN PATENT DOCUMENTS

| CN | 103730584 A | 4/2014 |
| CN | 104112766 A | 10/2014 |

(Continued)

*Primary Examiner* — Thao X Le
*Assistant Examiner* — Laura M Dykes
(74) *Attorney, Agent, or Firm* — Birch, Stewart, Kolasch & Birch, LLP

(57) ABSTRACT

An organic light emitting diode display device includes a substrate on which first, second and third pixel regions are defined; a first electrode in each of the first, second and third pixel regions on the substrate; a hole auxiliary layer on the first electrode; a first light emitting material layer on the hole auxiliary layer and emitting first light; an electron auxiliary layer on the first light emitting material layer; a second electrode on the electron auxiliary layer; and a color changing layer under the first electrode or on the second electrode, wherein the color changing layer includes first, second and third portions corresponding to the first, second and third pixel regions, respectively, and wherein the first portion absorbs the first light and outputs second light, the second portion absorbs the first light and outputs third light, and the third portion passes the first light as it is.

15 Claims, 7 Drawing Sheets

(56) References Cited

U.S. PATENT DOCUMENTS

| | | | | |
|---|---|---|---|---|
| 2009/0153041 A1* | 6/2009 | Kawakami | ........... | C07D 413/12 |
| | | | | 313/504 |
| 2012/0193619 A1* | 8/2012 | Taka | ................... | H01L 51/5278 |
| | | | | 257/40 |
| 2013/0153865 A1* | 6/2013 | Kho | ....................... | H01L 51/006 |
| | | | | 257/40 |
| 2016/0163768 A1* | 6/2016 | Song | ..................... | H01L 27/322 |
| | | | | 257/40 |
| 2016/0211465 A1* | 7/2016 | Tadao | ................. | H01L 51/0071 |
| 2017/0117444 A1* | 4/2017 | Stoll | .................... | H01L 51/5281 |
| 2017/0194387 A1* | 7/2017 | Oh | ....................... | H01L 51/5218 |
| 2017/0222173 A1* | 8/2017 | Matsusue | ............ | H01L 51/5044 |
| 2017/0256591 A1* | 9/2017 | Li | ...................... | G02F 1/133514 |
| 2017/0271605 A1* | 9/2017 | Steckel | ................ | C09K 11/025 |

FOREIGN PATENT DOCUMENTS

| | | | |
|---|---|---|---|
| CN | 105609656 A | 5/2016 | |
| WO | WO 2017/117935 A1 | 7/2017 | |

\* cited by examiner

ORGANIC LIGHT EMITTING DIODE DISPLAY DEVICE HAVING COLOR CHANGING LAYER

CROSS-REFERENCE TO RELATED APPLICATION

The present application claims priority from and the benefit under 35 U.S.C § 119(a) of Korean Patent Application No. 10-2016-0181465 filed on Dec. 28, 2016, which is hereby incorporated by reference in its entirety into the present application.

BACKGROUND OF THE INVENTION

Field of the Disclosure

The present disclosure relates to an organic light emitting diode display device, and more particularly, to an organic light emitting diode display device capable of improving light efficiency and color gamut.

Discussion of the Related Art

Recently, flat panel displays have been widely developed and applied to various fields because of their thin profile, light weight, and low power consumption.

Among the flat panel displays, organic light emitting diode (OLED) display devices, which may be referred to as organic electroluminescent display devices, emit light due to the radiative recombination of an exciton after forming the exciton from an electron and a hole by injecting charges into a light emitting layer between a cathode for injecting electrons and an anode for injecting holes.

The organic light emitting diode display devices generally include a flexible substrate such as plastic. Since they are self-luminous, the organic light emitting diode display devices have excellent contrast ratios. Further, the organic light emitting diode display devices have a response time of several micro seconds, and thus there are advantages in displaying moving images by such devices. Furthermore, the organic light emitting diode display devices have wide viewing angles and are stable under low temperatures. Since the organic light emitting diode display devices are driven by a low voltage of direct current (DC) 5V to 15V, it is easy to design and manufacture driving circuits. Moreover, the manufacturing processes of the organic light emitting diode display device are simple since only deposition and encapsulation steps are required.

FIG. 1 is a view of illustrating a band diagram of a related art organic light emitting diode display device.

In FIG. 1, the organic light emitting diode display device includes an anode 1, a cathode 7 and a light emitting material layer 4 between the anode 1 and the cathode 7. A hole transporting layer (HTL) 3 is disposed between the anode 1 and the light emitting material layer 4 for injecting holes into the light emitting material layer 4, and an electron transporting layer (ETL) 5 is disposed between the cathode 7 and the light emitting material layer 4 for injecting electrodes into the light emitting material layer 4. At this time, to further efficiently inject the holes and the electrons, a hole injecting layer (HIL) 2 may be disposed between the anode 1 and the hole transporting layer 3, and an electron injecting layer (EIL) 6 may be disposed between the cathode 7 and the electron transporting layer 5.

In the organic light emitting diode display device having the above-mentioned structure, a hole (+) injected into the light emitting material layer 4 through the hole injecting layer 2 and the hole transporting layer 3 from the anode 1 is combined with an electron (−) injected into the light emitting material layer 4 through the electron injecting layer 6 and the electron transporting layer 5 from the cathode 7, whereby an exciton 8 is generated and light is emitted from the exciton 8. Here, the light has a color corresponding to a band gap of the light emitting material layer 4.

The organic light emitting diode display devices can be classified into a bottom emission type, a top emission type and a both side emission type according to an output direction of light emitted from the light emitting material layer 4. The light emitted from the light emitting material layer 4 can be outputted to the outside through the anode 1 in the bottom emission type, can be outputted to the outside through the cathode 7 in the top emission type, and can be outputted to the outside through both the anode 1 and the cathode 7.

In the organic light emitting diode display device, one pixel includes red, green and blue sub pixels, and the red, green and blue sub pixels include the light emitting material layers 4 emitting red, green and blue light, respectively. The light emitted from the sub pixels is mixed to thereby display an image.

However, the related art organic light emitting diode display device has a problem that color gamut is low due to low color purity. At this time, to increase the color purity, a microcavity effect can be applied, and viewing angle becomes narrow.

In addition, the light emitting material layers 4 emitting red, green and blue light are formed of different materials and have different properties. Accordingly, the related art organic light emitting diode display device also has a problem that the red, green and blue sub pixels have different luminous efficiencies and different lifetimes.

SUMMARY OF THE INVENTION

Accordingly, the present disclosure is directed to an organic light emitting diode display device that substantially obviates one or more of the problems due to limitations and disadvantages of the related art.

An object of the present disclosure is to provide an organic light emitting diode display device having wide color gamut.

Another object of the present disclosure is to provide an organic light emitting diode display device including sub pixels, which have uniform luminous efficiencies and lifetimes.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an organic light emitting diode display device that includes a substrate on which first, second and third pixel regions are defined; a first electrode in each of the first, second and third pixel regions on the substrate; a hole auxiliary layer on the first electrode; a first light emitting material layer on the hole auxiliary layer and emitting first light; an electron auxiliary layer on the first light emitting material layer; a second electrode on the electron auxiliary layer; and a color changing layer under the first electrode or on the second electrode, wherein the color changing layer includes first, second and third portions corresponding to the first, second and third pixel regions, respectively, and wherein the first portion absorbs the first light and outputs second light, the second portion absorbs the first light and outputs third light, and the third portion passes the first light as it is.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION OF THE EMBODIMENTS

Reference will now be made in detail to embodiments of the disclosure, examples of which are illustrated in the accompanying drawings.

Figure 1:
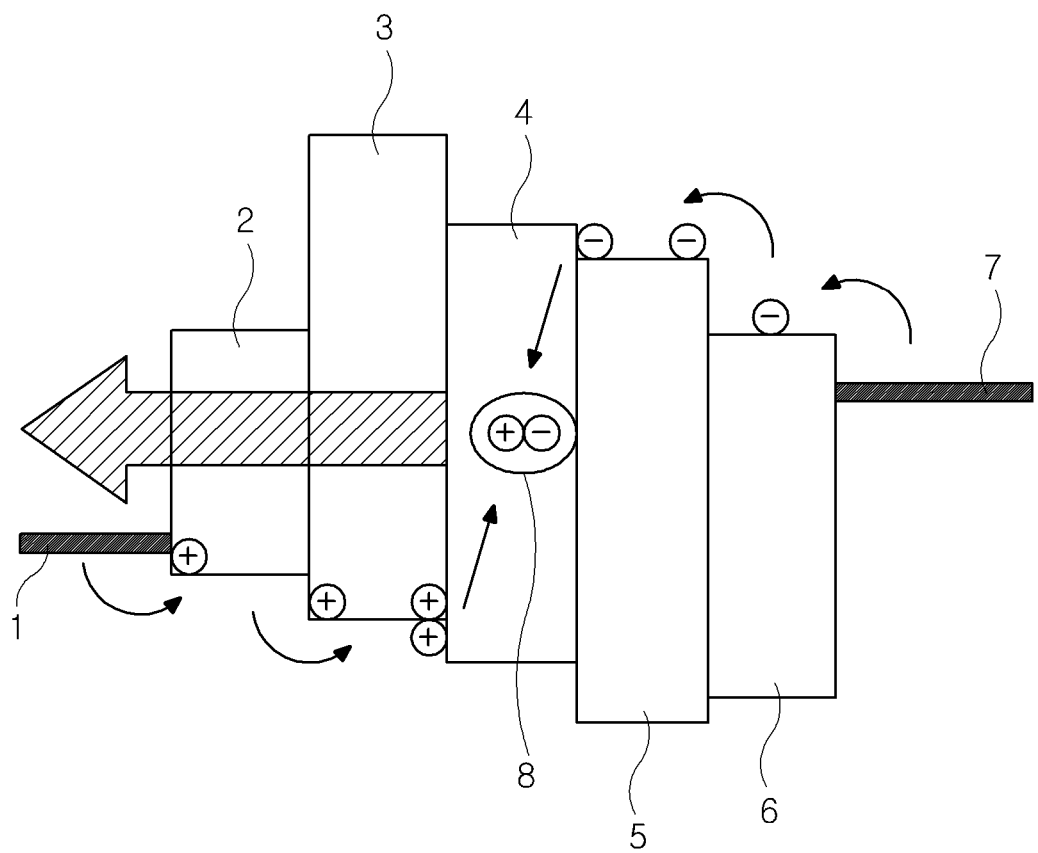
FIG. 1 is a view of illustrating a band diagram of a related art organic light emitting diode display device.
Figure 2:
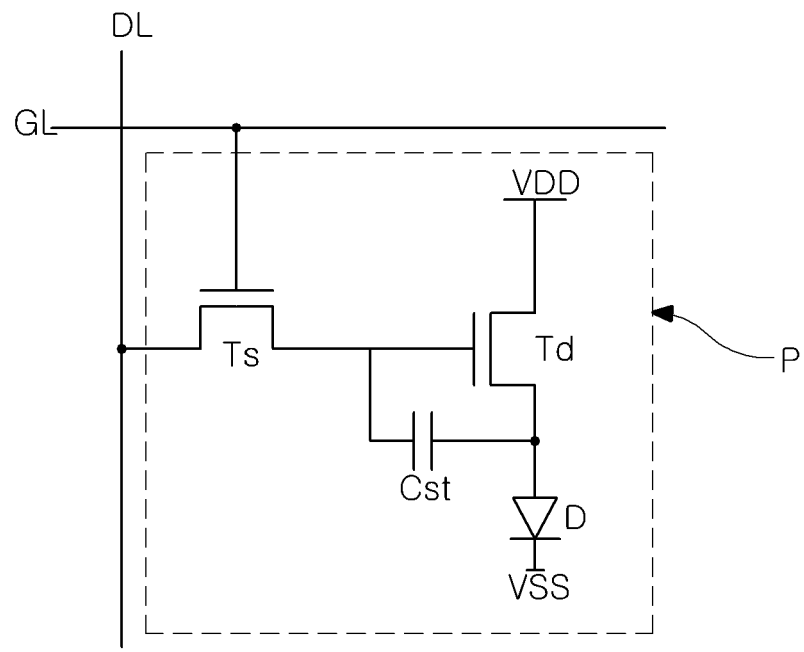
FIG. 2 is a circuit diagram of one pixel region of an organic light emitting diode display device according to an embodiment of the present disclosure.

FIG. 2 is a circuit diagram of one pixel region of an organic light emitting diode display device according to an embodiment of the present disclosure. All the components of the organic light emitting diode display device according to all embodiments of the present disclosure are operatively coupled and configured.

In FIG. 2, the organic light emitting diode display device according to the embodiment of the present disclosure includes a gate line GL, a data line DL, a switching thin film transistor Ts, a driving thin film transistor Td, a storage capacitor Cst and a light emitting diode D. The gate line GL and the data line DL cross each other to define a pixel region P. The switching thin film transistor Ts, the driving thin film transistor Td, the storage capacitor Cst and the light emitting diode D are formed in the pixel region P. The organic light emitting diode display device has a plurality of such pixel regions Ps.

More particularly, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light emitting diode D is connected to a drain electrode of the driving thin film transistor Td, and a cathode of the light emitting diode D is connected to a low voltage supply VSS. The storage capacitor Cst is connected to the gate electrode and the drain electrode of the driving thin film transistor Td.

The organic light emitting diode display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts. When the driving thin film transistor Td is turned on by the data signal, an electric current flowing through the light emitting diode D is controlled, thereby displaying an image. The light emitting diode D emits light due to the current supplied through the driving thin film transistor Td from the high voltage supply VDD.

Namely, the amount of the current flowing through the light emitting diode D is proportional to the magnitude of the data signal, and the intensity of light emitted by the light emitting diode D is proportional to the amount of the current flowing through the light emitting diode D. Thus, the pixel regions P show different gray levels depending on the magnitude of the data signal, and as a result, the organic light emitting diode display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light emitting diode D to be constant and the gray level shown by the light emitting diode D to be maintained until a next frame.

Meanwhile, in each of the pixel regions Ps, one or more transistors and/or capacitors may be added in addition to the switching thin film transistor Ts, the driving thin film transistor Td and the storage capacitor Cst.

Figure 3:
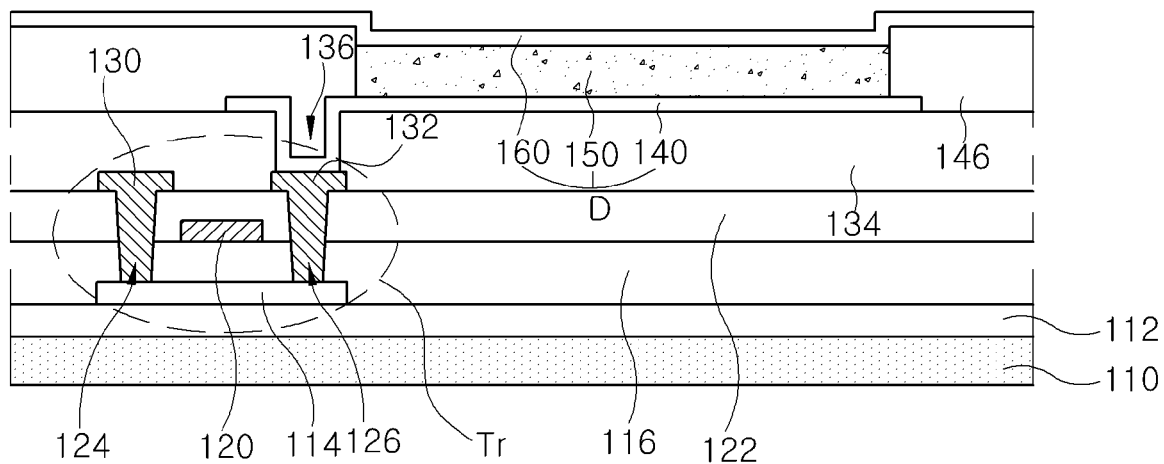
FIG. 3 is a cross-sectional view of an organic light emitting diode display device according to the embodiment of the present disclosure.

FIG. 3 is a cross-sectional view of an organic light emitting diode display device according to the embodiment of the present disclosure and shows one pixel region. However, the organic light emitting diode display device of FIG. 3 obviously includes a plurality of such pixel regions.

As shown in FIG. 3, the organic light emitting diode device according to the embodiment of the present disclosure can include a substrate 110, a thin film transistor Tr disposed on the substrate 110, and a light emitting diode D disposed on the substrate 110 and connected to the thin film transistor Tr. An encapsulation layer can be disposed on the light emitting diode D.

The substrate 110 can be a glass substrate or a flexible substrate formed of a polymer such as polyimide.

A buffer layer 112 can be formed on the substrate 110, and the thin film transistor Tr can be formed on the buffer layer 112. The buffer layer 112 can be formed of an inorganic insulating material such as silicon oxide ($SiO_2$) and silicon nitride (SiNx). The buffer layer 112 can be omitted.

A semiconductor layer 114 is formed on the buffer layer 112. The semiconductor layer 114 can be formed of an oxide semiconductor material or polycrystalline silicon. When the semiconductor layer 114 is formed of the oxide semiconductor material, a light-blocking pattern can be formed under the semiconductor layer 114. The light-blocking pattern blocks light from being incident on the semiconductor layer 114 to prevent the semiconductor layer 114 from being degraded by the light. Alternatively, the semiconductor layer 114 can be formed of polycrystalline silicon, and in this instance, impurities can be doped in both ends of the semiconductor layer 114.

A gate insulating layer 116 of an insulating material is formed on the semiconductor layer 114. The gate insulating layer 116 can be formed of an inorganic insulating material such as silicon oxide ($SiO_2$) and silicon nitride (SiNx).

A gate electrode 120 of a conductive material such as metal can be formed on the gate insulating layer 116 to correspond to a central portion of the semiconductor layer 114.

In FIG. 3, the gate insulating layer 116 is formed over substantially all of the substrate 110. Alternatively, the gate insulating layer 116 can be patterned to have the same shape as the gate electrode 120.

An interlayer insulating layer 122 of an insulating material is formed on the gate electrode 120. The interlayer insulating layer 122 can be formed over substantially all of the substrate 110. The interlayer insulating layer 122 can be formed of an inorganic insulating material such as silicon oxide ($SiO_2$) and silicon nitride (SiNx) or an organic insulating material such as benzocyclobutene and photo acryl.

The interlayer insulating layer 122 includes first and second contact holes 124 and 126 exposing top surfaces of both sides of the semiconductor layer 114. The first and second contact holes 124 and 126 are spaced apart from the gate electrode 120. The gate electrode 120 can be disposed between the first and second contact holes 124 and 126.

The first and second contact holes 124 and 126 are also formed in the gate insulating layer 116. Alternatively, when the gate insulating layer 116 is patterned to have the same shape as the gate electrode 120, the first and second contact holes 124 and 126 are formed only in the interlayer insulating layer 122.

A source electrode 130 and a drain electrode 132 of a conductive material such as metal are formed on the interlayer insulating layer 122.

The source and drain electrodes 130 and 132 are spaced apart from each other with respect to the gate electrode 120. The source and drain electrodes 130 and 132 contact both sides of the semiconductor layer 114 through the first and second contact holes 124 and 126, respectively.

In the organic light emitting diode display device, a thin film transistor Tr includes the semiconductor layer 114, the gate electrode 120, the source electrode 130 and the drain electrode 132. The thin film transistor Tr functions as a driving element and corresponds to the driving thin film transistor Td of FIG. 2.

The thin film transistor Tr can have a coplanar structure where the gate electrode 120 and the source and drain electrodes 130 and 132 are disposed at one side of the semiconductor layer 114, over the semiconductor layer 114.

Alternatively, the thin film transistor Tr can have an inverted staggered structure where the gate electrode is disposed under the semiconductor layer and the source and drain electrodes are disposed over the semiconductor layer. In this instance, the semiconductor layer can be formed of amorphous silicon.

A gate line and a data line cross each other to define a pixel region, and a switching element is connected to the gate line and the data line. The switching element is also connected to the thin film transistor Tr of the driving element. The switching element can have the same structure as the thin film transistor Tr.

In addition, a power line can be further formed in parallel to and apart from the gate line or the data line, and a storage capacitor can be further formed to constantly maintain a voltage at the gate electrode of the thin film transistor Tr during one frame.

A passivation layer 134 is formed on the source and drain electrodes 130 and 132. The passivation layer 134 can be formed over substantially all of the substrate 110. The passivation layer 134 covers the thin film transistor Tr and has a drain contact hole 136 exposing the drain electrode 132. The passivation layer 134 can be formed of an inorganic insulating material such as silicon oxide ($SiO_2$) and silicon nitride (SiNx) or an organic insulating material such as benzocyclobutene and photo acryl. The passivation layer 134 can have a flat top surface.

In FIG. 3, although the drain contact hole 136 is formed directly over the second contact hole 126, the drain contact hole 136 can be spaced apart from the second contact hole 126.

A first electrode 140 is formed on the passivation layer 134 and is connected to the drain electrode 132 of the thin film transistor Tr through the drain contact hole 136. The first electrode 140 is separately disposed in each pixel region. The first electrode 140 can be an anode and can be formed of a conductive material having a relatively high work function. For example, the first electrode 140 can be formed of a transparent conductive material such as indium tin oxide (ITO) and indium zinc oxide (IZO).

A bank layer 146 is formed on the first electrode 140 and the passivation layer 134. The bank layer 146 covers edges of the first electrode 140. The bank layer 146 exposes a central portion of the first electrode 140 corresponding to the pixel region.

A light emitting layer 150 is formed on the first electrode 140 exposed by the bank layer 146. A structure of the light emitting layer 150 will be described in detail later.

A second electrode 160 is formed over the substrate 110 on which the light emitting layer 150 is formed. The second electrode 160 can be formed over substantially all of a display area. The second electrode 160 can be formed of a conductive material having relatively low work function and can serve as a cathode. For example, the second electrode 160 can be formed of aluminum (Al), magnesium (Mg), silver (Ag) or their alloy, but is not limited to this.

The first electrode 140, the light emitting layer 150 and the second electrode 160 constitute a light emitting diode D.

The organic light emitting diode display device can be a bottom emission type where light emitted from the light emitting layer 150 is outputted to the outside through the first electrode 140.

Alternatively, the organic light emitting diode display device according to the present disclosure can be a top emission type where light emitted from the light emitting layer 150 is outputted to the outside through the second electrode 160. In this case, the first electrode 140 can further include a reflection electrode or reflection layer under the first electrode 140. For example, the reflection electrode or reflection layer can be formed of aluminum-palladiumcopper (APC) alloy. At this time, the second electrode 160 can have a relatively thin thickness such that light is transmitted therethrough.

First Embodiment

Figure 4:
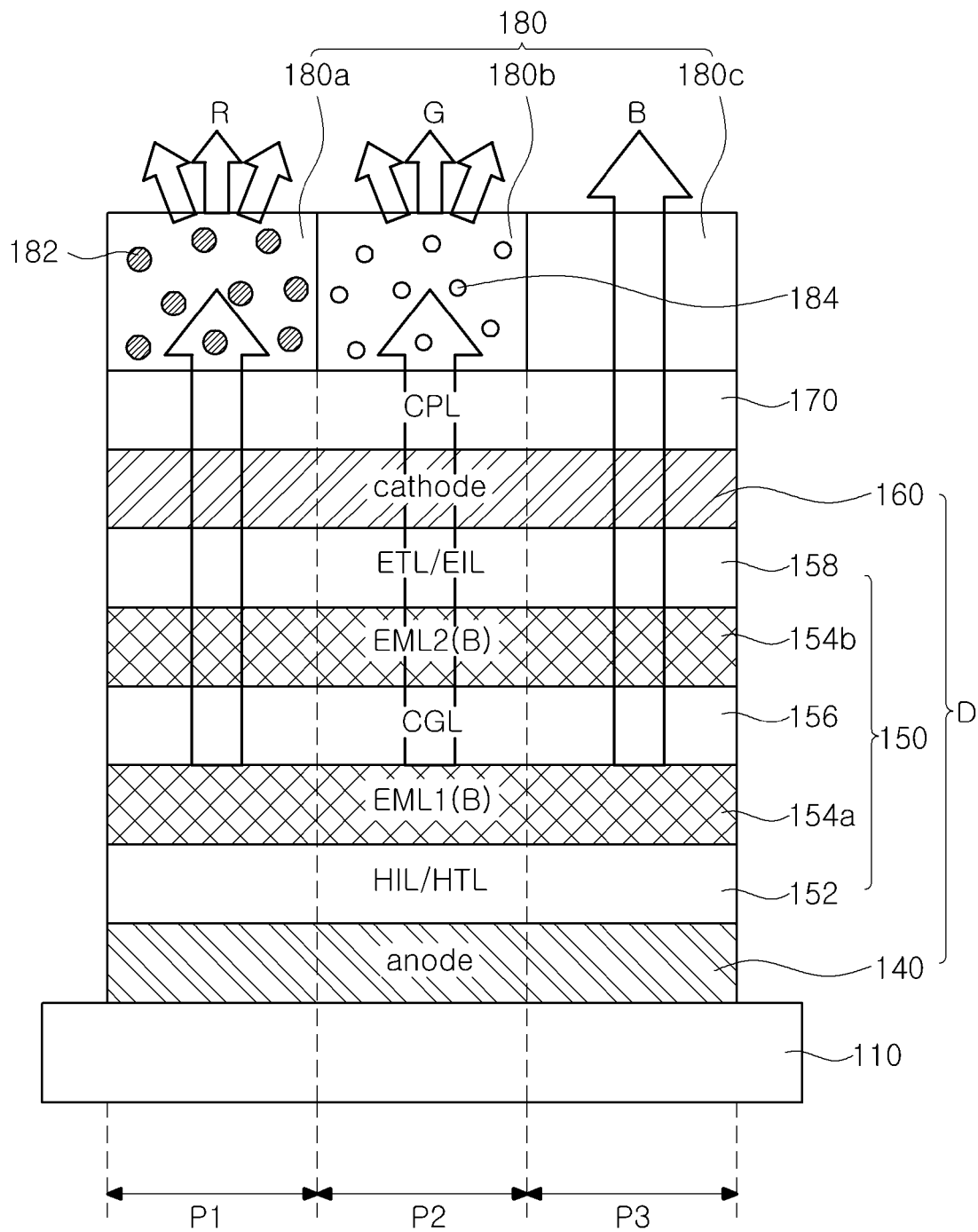
FIG. 4 is a schematic cross-sectional view of an organic light emitting diode display device according to a first embodiment of the present disclosure.

FIG. 4 is a schematic cross-sectional view of an organic light emitting diode display device according to a first embodiment of the present disclosure and shows a pixel. However, the organic light emitting diode display device of FIG. 4 obviously includes a plurality of pixels or pixel regions.

In FIG. 4, first, second and third pixel regions P1, P2 and P3 are defined on a substrate 110. A light emitting diode D is disposed in each pixel region P1, P2 and P3. The first, second and third pixel regions P1, P2 and P3 correspond to red, green and blue sub pixels, respectively.

The light emitting diode D includes a first electrode 140, a light emitting layer 150 and a second electrode 160. The light emitting layer 150 includes a hole auxiliary layer 152, a first light emitting material layer 154a, a charge generation layer 156, a second light emitting material layer 154b, and an electron auxiliary layer 158.

More particularly, the first electrode 140 is formed in each of the first, second and third pixel regions P1, P2 and P3 as an anode. In the figure, although the first electrodes 140 in the first, second and third pixel regions P1, P2 and P3 are connected to each other, the first electrodes 140 in the first, second and third pixel regions P1, P2 and P3 are separated from each other.

The first electrode 140 can be formed of a transparent conductive material such as indium tin oxide (ITO) and indium zinc oxide (IZO). In addition, a reflection electrode or a reflection layer can be further formed under the first electrode 140. For example, the reflection electrode or the reflection layer can be formed of aluminum-palladium-copper (APC) alloy.

Meanwhile, the first electrode 140 can include a reflection electrode, and in this case, the first electrode 140 can have a triple-layered structure of ITO/APC/ITO.

The hole auxiliary layer 152 is formed on the first electrode 140 in each of the first, second and third pixel regions P1, P2 and P3. The hole auxiliary layer 152 can include at least one of a hole injecting layer (HIL) and a hole transporting layer (HTL). Here, the hole auxiliary layers 152 in the first, second and third pixel regions P1, P2 and P3 are formed of the same material, have the same structure and have the same thickness.

The hole auxiliary layer 152 in one pixel region P1, P2 and P3 can be connected to another hole auxiliary layer 152 in a next pixel region P1, P2 and P3 to form one body. Alternatively, the hole auxiliary layer 152 can be separated by the first, second and third pixel regions P1, P2 and P3.

The hole auxiliary layer 152 can be formed through a vacuum evaporation process. Alternatively, the hole auxiliary layer 152 can be formed through a soluble process.

The first light emitting material layer 154a is formed on the hole auxiliary layer 152 in each of the first, second and third pixel regions P1, P2 and P3. The first light emitting material layer 154a includes a blue light emitting material emitting blue light.

The first light emitting material layer 154a in one pixel region P1, P2 and P3 can be connected to another first light emitting material layer 154a in a next pixel region P1, P2 and P3 to form one body. Alternatively, the first light emitting material layer 154a can be separated by the first, second and third pixel regions P1, P2 and P3.

The first light emitting material layer 154a can be formed through a vacuum evaporation process. At this time, the first light emitting material layer 154a can include an anthracene derivative, a benzofluorene derivative, or an iridium (Ir) derivative as a dopant, but is not limited to this. Here, Firpic can be used as the Ir derivative.

Alternatively, the first light emitting material layer 154a can be formed through a soluble process. At this time, the first light emitting material layer 154a can include poly(N-vinylcarbazole), polyphenylphenyl dendron, or conjugated triphenylene polymers as a dopant, but is not limited to this.

The charge generation layer (CGL) 156 is formed on the first light emitting material layer 154a in each of the first, second and third pixel regions P1, P2 and P3.

The charge generation layer 156 generates and provides electrons and holes. The charge generation layer 156 can have a PN junction structure in which an N-type charge generation layer and a p-type charge generation layer are bonded. At this time, the N-type charge generation layer is disposed over the first light emitting material layer 154a and the P-type charge generation layer.

Meanwhile, a metal layer can be further formed between the N-type charge generation layer and the P-type charge generation layer. Preferably, the metal layer has a thickness of 4 nm or less. For example, the metal layer can be formed of aluminum (Al) or silver (Ag), but is not limited to this.

The charge generation layer 156 can be formed through a vacuum evaporation process. At this time, the N-type charge generation layer can have a single layer structure of an electron transporting material doped with an electron injecting material or a double layer structure in which an electron injecting material and an electron transporting material are sequentially stacked, but is not limited to this. The P-type charge generation layer can have a single layer structure of a hole transporting material doped with a hole injecting material or a double layer structure in which a hole transporting material and a hole injecting material are sequentially stacked, but is not limited to this. For example, LiF, CsCO3, NaF, Ca, Ba, Na, Li, LiQ and the like can be used as the electron injecting material, and BPhen, TPBi, B3PyPB, BCP and the like can be used as the electron transporting material, but are not limited to this. In addition, TAPC, TCTA, NPB, NPD and the like can be used as the hole transporting material, and MoO3, WO3, V2O5, ReO3, HATCN, F4TCNQ and the like can be used as the hole injecting material, but are not limited to this.

Alternatively, the charge generation layer 156 can be formed through a soluble process. At this time, PEDOT:PSS, PMA/TFB, WO3/PEDOT:PSS and the like can be used as the charge generation layer 156.

The second light emitting material layer 154b is formed on the charge generation layer 156 in each of the first, second and third pixel regions P1, P2 and P3. The second light emitting material layer 154b is formed of a blue light emitting material emitting blue light.

The second light emitting material layer 154b in one pixel region P1, P2 and P3 can be connected to another second light emitting material layer 154b in a next pixel region P1, P2 and P3 to form one body. Alternatively, the second light emitting material layer 154b can be separated by the first, second and third pixel regions P1, P2 and P3.

The second light emitting material layer 154b can be formed through a vacuum evaporation process. At this time, the second light emitting material layer 154b can include an anthracene derivative, a benzofluorene derivative, or an iridium (Ir) derivative as a dopant, but is not limited to this. Here, Firpic can be used as the Ir derivative.

A thickness of the second light emitting material layer 154b is equal to or smaller than a thickness of the first light emitting material layer 154a. For example, the thickness of the first light emitting material layer 154a can be 20 nm to 60 nm, and the thickness of the second light emitting material layer 154b can be 20 nm to 30 nm, but is not limited to this.

In the meantime, a buffer layer can be further formed between the first light emitting material layer 154a and the charge generation layer 156 or between the charge generation layer 156 and the second light emitting material layer 154b. The buffer layer is formed through a vacuum evaporation process and increases the mobility of charges at an interface between a layer formed through a soluble process and a layer through a vacuum evaporation process.

Accordingly, when the first light emitting material layer 154a is formed through the soluble process and the charge generation layer 156 is formed through the vacuum evaporation process, the buffer layer is disposed between the first light emitting material layer 154a and the charge generation layer 156.

Alternatively, when the first light emitting material layer 154a and the charge generation layer 156 are formed through the soluble process, the buffer layer is disposed between the charge generation layer 156 and the second light emitting material layer 154b, which is formed through the vacuum evaporation process.

The buffer layer can be formed of a bipolar compound, and the bipolar compound can be a monomolecular material having both electron properties and hole properties. More specifically, the bipolar compound is a material in which an electron-affinity core and a hole-affinity core are synthesized as a compound. For example, the bipolar compound can include an arylamine group and one of a heteroaryl group, a silicon group having an aromatic substituent and a sulfonyl group in a molecule, but is not limited to this.

The buffer layer has a relatively thin thickness of 1 nm to 5 nm, and beneficially, 1 nm to 3 nm.

In addition, an electron transporting layer can be further formed between the first light emitting material layer 154a and the charge generation layer 156, and a hole transporting layer can be further formed between the charge generation layer 156 and the second light emitting material layer 154b. At this time, the electron transporting layer and the charge generation layer 156 can be formed through a vacuum evaporation process, and the buffer layer can be formed between the first light emitting material layer 154a formed through the soluble process and the electron transporting layer.

The charge generation layer 156 and the second light emitting material layer 154b can be omitted.

The electron auxiliary layer 158 is formed on the second light emitting material layer 154b in each of the first, second and third pixel regions P1, P2 and P3. The electron auxiliary layer 158 can include at least one of an electron transporting layer and an electron auxiliary layer.

The electron auxiliary layer 158 in one pixel region P1, P2 and P3 can be connected to another electron auxiliary layer 158 in a next pixel region P1, P2 and P3 to form one body. Alternatively, the electron auxiliary layer 158 can be separated by the first, second and third pixel regions P1, P2 and P3.

The electron auxiliary layer 158 can be formed through a vacuum evaporation process.

The second electrode 160 is formed on the electron auxiliary layer 158 in each of the first, second and third pixel regions P1, P2 and P3 as a cathode. The second electrode 160 in one pixel region P1, P2 and P3 can be connected to another second electrode 160 in a next pixel region P1, P2 and P3 to form one body. The second electrode 160 can be formed over substantially all of the substrate 110.

The second electrode 160 can be formed of a conductive material having relatively low work function. For example, the second electrode 160 can be formed of aluminum (Al), magnesium (Mg), silver (Ag) or their alloy, but is not limited to this.

Here, light emitted from the first and second light emitting material layers 154a and 154b is outputted to the outside through the second electrode 160. The second electrode 160 can have a relatively thin thickness such that the light emitted from the first and second light emitting material layers 154a and 154b passes therethrough.

As mentioned above, the first electrode 140, the light emitting layer 150 and the second electrode 160 constitute the light emitting diode D.

Meanwhile, a capping layer 170 is formed on the second electrode 160. The capping layer 170 can be formed over substantially all of the substrate 110 like the second electrode 160. The capping layer 170 can be formed of an organic material having a relatively high refractive index. At this time, the wavelength of light moving along the capping layer 170 is amplified by surface plasma resonance, and thus the intensity of the peak is increased, thereby improving the light efficiency in the top emission type organic light emitting diode display device.

The capping layer 170 can be omitted.

Next, an encapsulation layer 180 is formed on the capping layer 170. The encapsulation layer 180 protects the light emitting diode D by blocking moisture or oxygen from the outside. The encapsulation layer 180 can be formed of a polymer functioning as an absorber or a buffer.

Here, a single layer including an inorganic layer or multiple layers including inorganic and organic layers can be further formed between the capping layer 170 and the encapsulation layer 180.

In the meantime, the encapsulation layer 180 functions as a color changing layer. More specifically, the encapsulation layer 180 includes first, second and third portions 180a, 180b and 180c corresponding to the first, second and third pixel regions P1, P2 and P3, respectively. The first portion 180a includes a first color changing material 182, the second portion 180b includes a second color changing material 184, and the third portion 180c does not include any color changing material.

The first color changing material 182 in the first portion 180a absorbs blue light and emits red light, and the second color changing material 184 in the second portion 180b absorbs blue light and emits green light.

The first and second color changing materials 182 and 184 can be quantum dots. At this time, the first and second color changing materials 182 and 184 can have different sizes.

Each quantum dot includes a core, and it is beneficial that a size of the core is 2 nm to 10 nm. The quantum dot can include only the core. Alternatively, the quantum dot can include a core and a shell or a core and first and second shells, but is not limited to this.

The quantum dot can be formed of PbS, PbSe, CdSe, CdS, InAs, or InP, but is not limited to this.

For example, the encapsulation layer 180 of the present disclosure can be formed by printing an adhesive polymer including the color changing materials 182 and 184 in a liquid phase or laminating a film including the color changing materials 182 and 184.

In the organic light emitting diode display device according to the first embodiment of the present disclosure, blue light emitted from the first and second light emitting material layers 154a and 154b is outputted to the outside through the second electrode 160. That is, the organic light emitting diode display device according to the first embodiment of the present disclosure is a top emission type.

At this time, while passing through the encapsulation layer 180, the blue light emitted from the first and second light emitting material layers 154a and 154b is changed into red light R to be outputted in the first pixel region P1, is changed into green light G to be outputted in the second pixel region P2, and is outputted without a change in the third pixel region P3.

More particularly, in the first pixel region P1, the first color changing material 182 in the first portion 180a of the encapsulation layer 180 absorbs the blue light emitted from the first and second light emitting material layers 154a and 154b and emits the red light R. In the second pixel region P2, the second color changing material 184 in the second portion 180b of the encapsulation layer 180 absorbs the blue light emitted from the first and second light emitting material layers 154a and 154b and emits the green light G. On the other hand, in the third pixel region P3, since the third portion 180c of the encapsulation layer 180 does not include any color changing material, the blue light emitted from the first and second light emitting material layers 154a and 154b passes through the third portion 180c as it is.

Meanwhile, the microcavity effect can be applied to the organic light emitting diode display device according to the first embodiment of the present disclosure in order to increase the color purity. At this time, the first light emitting material layer 154a can be formed in a position satisfying the first order cavity condition, and the second light emitting material layer 154b can be formed in a position satisfying the second order cavity condition. Alternatively, the first light emitting material layer 154a can be formed in a position satisfying the second order cavity condition, and the second light emitting material layer 154b can be formed in a position satisfying the third order cavity condition.

Figure 5:
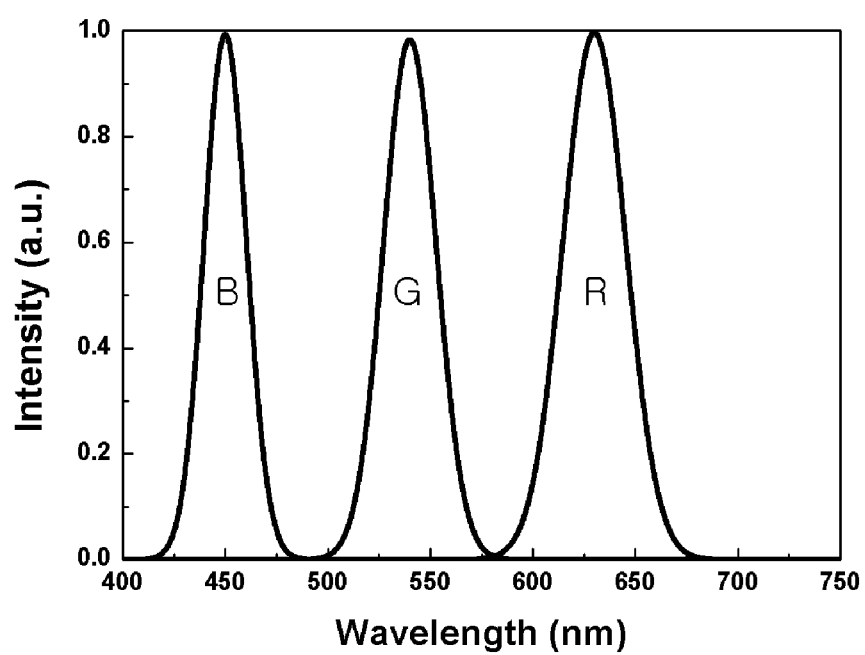
FIG. 5 is a view showing the spectrum of light emitted from the organic light emitting diode display device according to the first embodiment of the present disclosure.

The spectrum of red, green and blue light R, G and B emitted from the organic light emitting diode display device according to the first embodiment of the present disclosure is as shown in FIG. 5. FIG. 5 is a view showing the spectrum of light emitted from the organic light emitting diode display device according to the first embodiment of the present disclosure.

As described above, in the organic light emitting diode display device according to the first embodiment of the present disclosure, the red, green and blue light R, G and B is outputted by using the color changing materials 182 and 184 such as the quantum dot. Thus, the color purity can be increased, and the light efficiency can be improved. At this time, the color purity can be further increased by applying the microcavity effect.

The color changing materials 182 and 184 scatter light such that light is emitted in a direction other than the front direction, and thus the viewing angle can be improved.

In addition, since the light emitting material layers 154a and 154b emitting single color light, i.e., blue light are used for the first, second and third pixel regions P1, P2 and P3, the luminous efficiencies and lifetimes can be uniform in the first, second and third pixel regions P1, P2 and P3.

Moreover, since the light emitting material layers 154a and 154b are formed as a stack structure, the driving voltage can be reduced, and the luminous efficiency and the lifetime can be improved.

Second Embodiment

Figure 6:
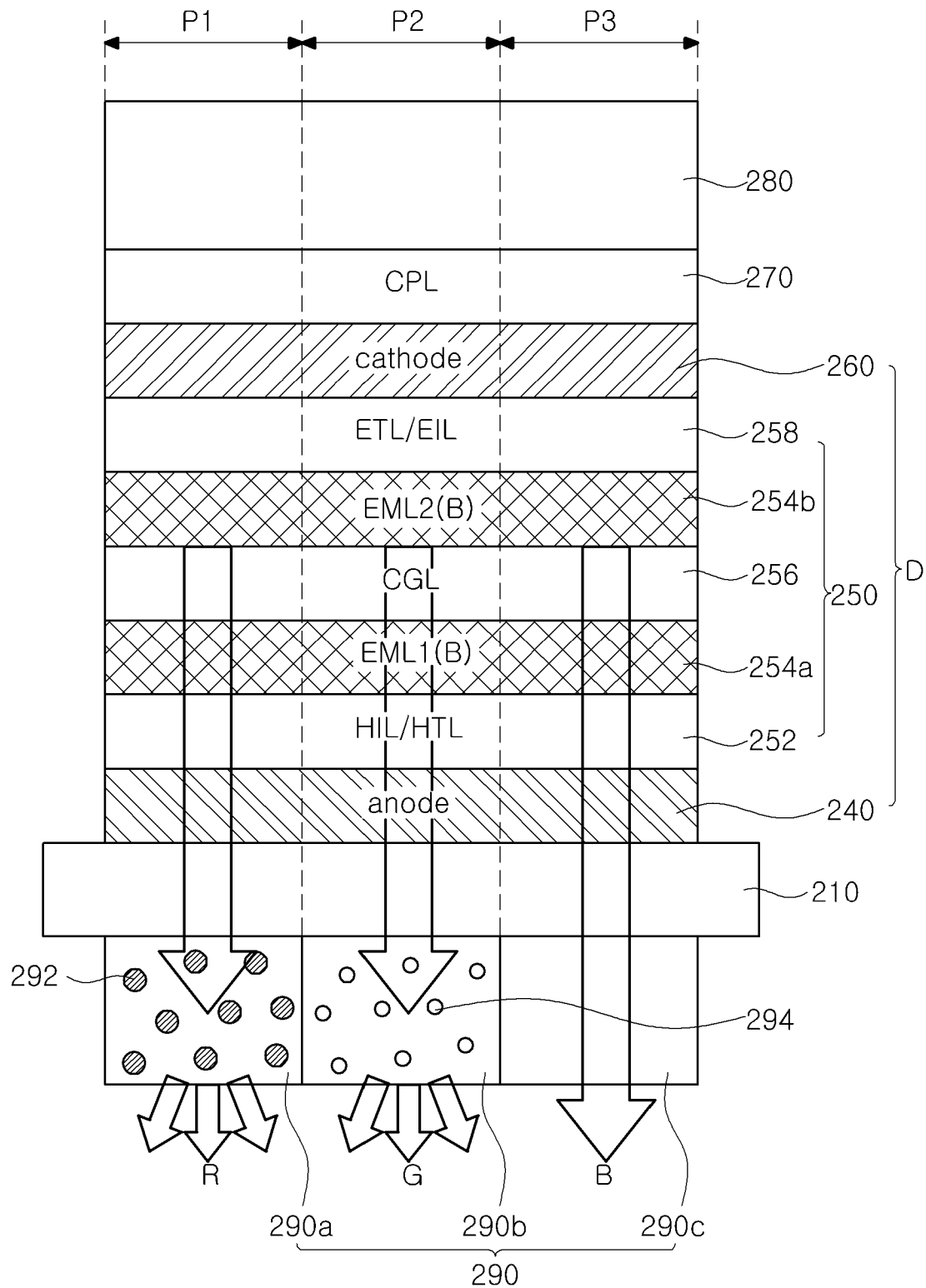
FIG. 6 is a schematic cross-sectional view of an organic light emitting diode display device according to a second embodiment of the present disclosure.

FIG. 6 is a schematic cross-sectional view of an organic light emitting diode display device according to a second embodiment of the present disclosure and shows a pixel. However, the organic light emitting diode display device of FIG. 6 obviously includes a plurality of pixels or pixel regions.

In FIG. 6, first, second and third pixel regions P1, P2 and P3 are defined on a substrate 210. A light emitting diode D is disposed in each pixel region P1, P2 and P3. The first, second and third pixel regions P1, P2 and P3 correspond to red, green and blue sub pixels, respectively.

The light emitting diode D includes a first electrode 240, a light emitting layer 250 and a second electrode 260. The light emitting layer 250 includes a hole auxiliary layer 252, a first light emitting material layer 254a, a charge generation layer 256, a second light emitting material layer 254b, and an electron auxiliary layer 258.

More particularly, the first electrode 240 is formed in each of the first, second and third pixel regions P1, P2 and P3 as an anode. In the figure, although the first electrodes 240 in the first, second and third pixel regions P1, P2 and P3 are connected to each other, the first electrodes 240 in the first, second and third pixel regions P1, P2 and P3 are separated from each other.

The first electrode 240 can be formed of a transparent conductive material such as indium tin oxide (ITO) and indium zinc oxide (IZO).

The hole auxiliary layer 252 is formed on the first electrode 240 in each of the first, second and third pixel regions P1, P2 and P3. The hole auxiliary layer 252 can include at least one of a hole injecting layer (HIL) and a hole transporting layer (HTL). Here, the hole auxiliary layers 252 in the first, second and third pixel regions P1, P2 and P3 are formed of the same material, have the same structure and have the same thickness.

The hole auxiliary layer 252 in one pixel region P1, P2 and P3 can be connected to another hole auxiliary layer 252 in a next pixel region P1, P2 and P3 to form one body. Alternatively, the hole auxiliary layer 252 can be separated by the first, second and third pixel regions P1, P2 and P3.

The hole auxiliary layer 252 can be formed through a vacuum evaporation process. Alternatively, the hole auxiliary layer 252 can be formed through a soluble process.

The first light emitting material layer 254a is formed on the hole auxiliary layer 252 in each of the first, second and third pixel regions P1, P2 and P3. The first light emitting material layer 254a includes a blue light emitting material emitting blue light.

The first light emitting material layer 254a in one pixel region P1, P2 and P3 can be connected to another first light emitting material layer 254a in a next pixel region P1, P2 and P3 to form one body. Alternatively, the first light emitting material layer 254a can be separated by the first, second and third pixel regions P1, P2 and P3.

The first light emitting material layer 254a can be formed through a vacuum evaporation process. At this time, the first light emitting material layer 254a can include an anthracene derivative, a benzofluorene derivative, or an iridium (Ir) derivative as a dopant, but is not limited to this. Here, Firpic can be used as the Ir derivative.

Alternatively, the first light emitting material layer 254a can be formed through a soluble process. At this time, the first light emitting material layer 254a can include poly(N-vinylcarbazole), polyphenylphenyl dendron, or conjugated triphenylene polymers as a dopant, but is not limited to this.

The charge generation layer (CGL) 256 is formed on the first light emitting material layer 254a in each of the first, second and third pixel regions P1, P2 and P3.

The charge generation layer 256 generates and provides electrons and holes. The charge generation layer 256 can have a PN junction structure in which an N-type charge generation layer and a p-type charge generation layer are bonded. At this time, the N-type charge generation layer is disposed over the first light emitting material layer 254a and the P-type charge generation layer.

Meanwhile, a metal layer can be further formed between the N-type charge generation layer and the P-type charge generation layer. Preferably, the metal layer has a thickness of 4 nm or less. For example, the metal layer can be formed of aluminum (Al) or silver (Ag), but is not limited to this.

The charge generation layer 256 can be formed through a vacuum evaporation process. At this time, the N-type charge generation layer can have a single layer structure of an electron transporting material doped with an electron injecting material or a double layer structure in which an electron injecting material and an electron transporting material are sequentially stacked, but is not limited to this. The P-type charge generation layer can have a single layer structure of a hole transporting material doped with a hole injecting material or a double layer structure in which a hole transporting material and a hole injecting material are sequentially stacked, but is not limited to this. For example, LiF, CsCO3, NaF, Ca, Ba, Na, Li, LiQ and the like can be used as the electron injecting material, and BPhen, TPBi, B3PyPB, BCP and the like can be used as the electron transporting material, but are not limited to this. In addition, TAPC, TCTA, NPB, NPD and the like can be used as the hole transporting material, and MoO3, WO3, V2O5, ReO3, HATCN, F4TCNQ and the like can be used as the hole injecting material, but are not limited to this.

Alternatively, the charge generation layer 256 can be formed through a soluble process. At this time, PEDOT:PSS, PMA/TFB, WO3/PEDOT:PSS and the like can be used as the charge generation layer 256.

The second light emitting material layer 254b is formed on the charge generation layer 256 in each of the first, second and third pixel regions P1, P2 and P3. The second light emitting material layer 254b is formed of a blue light emitting material emitting blue light.

The second light emitting material layer 254b in one pixel region P1, P2 and P3 can be connected to another second light emitting material layer 254b in a next pixel region P1, P2 and P3 to form one body. Alternatively, the second light emitting material layer 254b can be separated by the first, second and third pixel regions P1, P2 and P3.

The second light emitting material layer 254b can be formed through a vacuum evaporation process. At this time, the second light emitting material layer 254b can include an anthracene derivative, a benzofluorene derivative, or an iridium (Ir) derivative as a dopant, but is not limited to this. Here, Firpic can be used as the Ir derivative.

A thickness of the second light emitting material layer 254b is equal to or smaller than a thickness of the first light emitting material layer 254a. For example, the thickness of the first light emitting material layer 254a can be 20 nm to 60 nm, and the thickness of the second light emitting material layer 254b can be 20 nm to 30 nm, but is not limited to this.

In the meantime, a buffer layer can be further formed between the first light emitting material layer 254a and the charge generation layer 256 or between the charge generation layer 256 and the second light emitting material layer 254b. The buffer layer is formed through a vacuum evaporation process and increases the mobility of charges at an interface between a layer formed through a soluble process and a layer through a vacuum evaporation process.

Accordingly, when the first light emitting material layer 254a is formed through the soluble process and the charge generation layer 256 is formed through the vacuum evaporation process, the buffer layer is disposed between the first light emitting material layer 254a and the charge generation layer 256.

Alternatively, when the first light emitting material layer 254a and the charge generation layer 256 are formed through the soluble process, the buffer layer is disposed between the charge generation layer 256 and the second light emitting material layer 254b, which is formed through the vacuum evaporation process.

The buffer layer can be formed of a bipolar compound, and the bipolar compound can be a monomolecular material having both electron properties and hole properties. More specifically, the bipolar compound is a material in which an electron-affinity core and a hole-affinity core are synthesized as a compound. For example, the bipolar compound can include an arylamine group and one of a heteroaryl group, a silicon group having an aromatic substituent and a sulfonyl group in a molecule, but is not limited to this.

The buffer layer has a relatively thin thickness of 1 nm to 5 nm, and beneficially, 1 nm to 3 nm.

In addition, an electron transporting layer can be further formed between the first light emitting material layer 254a and the charge generation layer 256, and a hole transporting layer can be further formed between the charge generation layer 256 and the second light emitting material layer 254b.

At this time, the electron transporting layer and the charge generation layer 256 can be formed through a vacuum evaporation process, and the buffer layer can be formed between the first light emitting material layer 254a formed through the soluble process and the electron transporting layer.

The charge generation layer 256 and the second light emitting material layer 254b can be omitted.

The electron auxiliary layer 258 is formed on the second light emitting material layer 254b in each of the first, second and third pixel regions P1, P2 and P3. The electron auxiliary layer 258 can include at least one of an electron transporting layer and an electron auxiliary layer.

The electron auxiliary layer 258 in one pixel region P1, P2 and P3 can be connected to another electron auxiliary layer 258 in a next pixel region P1, P2 and P3 to form one body. Alternatively, the electron auxiliary layer 258 can be separated by the first, second and third pixel regions P1, P2 and P3.

The electron auxiliary layer 258 can be formed through a vacuum evaporation process.

The second electrode 260 is formed on the electron auxiliary layer 258 in each of the first, second and third pixel regions P1, P2 and P3 as a cathode. The second electrode 260 in one pixel region P1, P2 and P3 can be connected to another second electrode 260 in a next pixel region P1, P2 and P3 to form one body. The second electrode 260 can be formed over substantially all of the substrate 110.

The second electrode 260 can be formed of a conductive material having relatively low work function. For example, the second electrode 260 can be formed of aluminum (Al), magnesium (Mg), silver (Ag) or their alloy, but is not limited to this.

As mentioned above, the first electrode 240, the light emitting layer 250 and the second electrode 260 constitute the light emitting diode D.

Meanwhile, a capping layer 270 is formed on the second electrode 260. The capping layer 270 can be formed over substantially all of the substrate 210 like the second electrode 260.

The capping layer 270 can be omitted.

Next, an encapsulation layer 280 is formed on the capping layer 270. The encapsulation layer 280 protects the light emitting diode D by blocking moisture or oxygen from the outside. The encapsulation layer 280 can be formed of a polymer functioning as an absorber or a buffer.

Here, a single layer including an inorganic layer or multiple layers including inorganic and organic layers can be further formed between the capping layer 270 and the encapsulation layer 280.

In the meantime, a color changing layer 290 is formed under the substrate 210. The color changing layer 290 includes first, second and third portions 290a, 290b and 290c corresponding to the first, second and third pixel regions P1, P2 and P3, respectively. The first portion 290a includes a first color changing material 292, the second portion 290b includes a second color changing material 294, and the third portion 290c does not include any color changing material.

The first color changing material 292 in the first portion 290a absorbs blue light and emits red light, and the second color changing material 294 in the second portion 290b absorbs blue light and emits green light.

The first and second color changing materials 292 and 294 can be quantum dots. At this time, the first and second color changing materials 292 and 294 can have different sizes.

Each quantum dot includes a core, and it is beneficial that a size of the core is 2 nm to 10 nm. The quantum dot can include only the core. Alternatively, the quantum dot can include a core and a shell or a core and first and second shells, but is not limited to this.

The quantum dot can be formed of PbS, PbSe, CdSe, CdS, InAs, or InP, but is not limited to this.

For example, the encapsulation layer 290 of the present disclosure can be formed by printing an adhesive polymer including the color changing materials 292 and 294 in a liquid phase or laminating a film including the color changing materials 292 and 294.

Meanwhile, the color changing layer 290 can be disposed between the substrate 210 and the first electrode 240.

In the organic light emitting diode display device according to the second embodiment of the present disclosure, blue light emitted from the first and second light emitting material layers 254a and 254b is outputted to the outside through the first electrode 240. That is, the organic light emitting diode display device according to the second embodiment of the present disclosure is a bottom emission type.

At this time, while passing through the color changing layer 290, the blue light emitted from the first and second light emitting material layers 254a and 254b is changed into red light R to be outputted in the first pixel region P1, is changed into green light G to be outputted in the second pixel region P2, and is outputted without a change in the third pixel region P3.

More particularly, in the first pixel region P1, the first color changing material 292 in the first portion 290a of the color changing layer 290 absorbs the blue light emitted from the first and second light emitting material layers 254a and 254b and emits the red light R. In the second pixel region P2, the second color changing material 294 in the second portion 290b of the color changing layer 290 absorbs the blue light emitted from the first and second light emitting material layers 254a and 254b and emits the green light G. On the other hand, in the third pixel region P3, since the third portion 290c of the color changing layer 290 does not include any color changing material, the blue light emitted from the first and second light emitting material layers 254a and 254b passes through the third portion 290c as it is.

Figure 7:
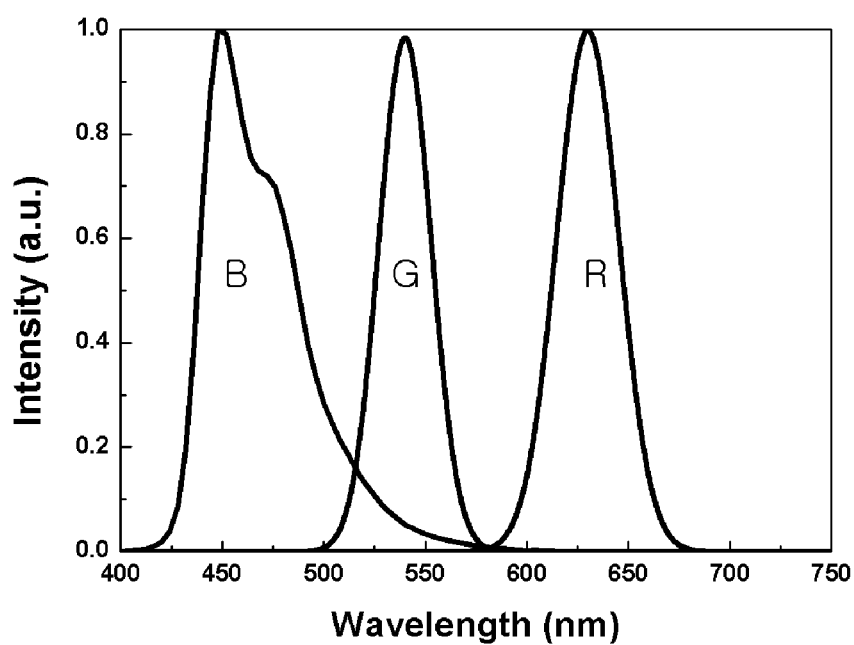
FIG. 7 is a view showing the spectrum of light emitted from the organic light emitting diode display device according to the second embodiment of the present disclosure.

The spectrum of red, green and blue light R, G and B emitted from the organic light emitting diode display device according to the first embodiment of the present disclosure is as shown in FIG. 7. FIG. 7 is a view showing the spectrum of light emitted from the organic light emitting diode display device according to the second embodiment of the present disclosure.

As described above, in the organic light emitting diode display device according to the second embodiment of the present disclosure, the red, green and blue light R, G and B is outputted by using the color changing materials 292 and 294 such as the quantum dot. Thus, the color purity can be increased, and the light efficiency can be improved. At this time, the color purity can be further increased by applying the microcavity effect.

The color changing materials 292 and 294 scatter light such that light is emitted in a direction other than the front direction, and thus the viewing angle can be improved.

In addition, since the light emitting material layers 254a and 254b emitting single color light, i.e., blue light are used for the first, second and third pixel regions P1, P2 and P3, the luminous efficiencies and lifetimes can be uniform in the first, second and third pixel regions P1, P2 and P3.

Moreover, since the light emitting material layers 254a and 254b are formed as a stack structure, the driving voltage can be reduced, and the luminous efficiency and the lifetime can be improved.

Third Embodiment

Figure 8:
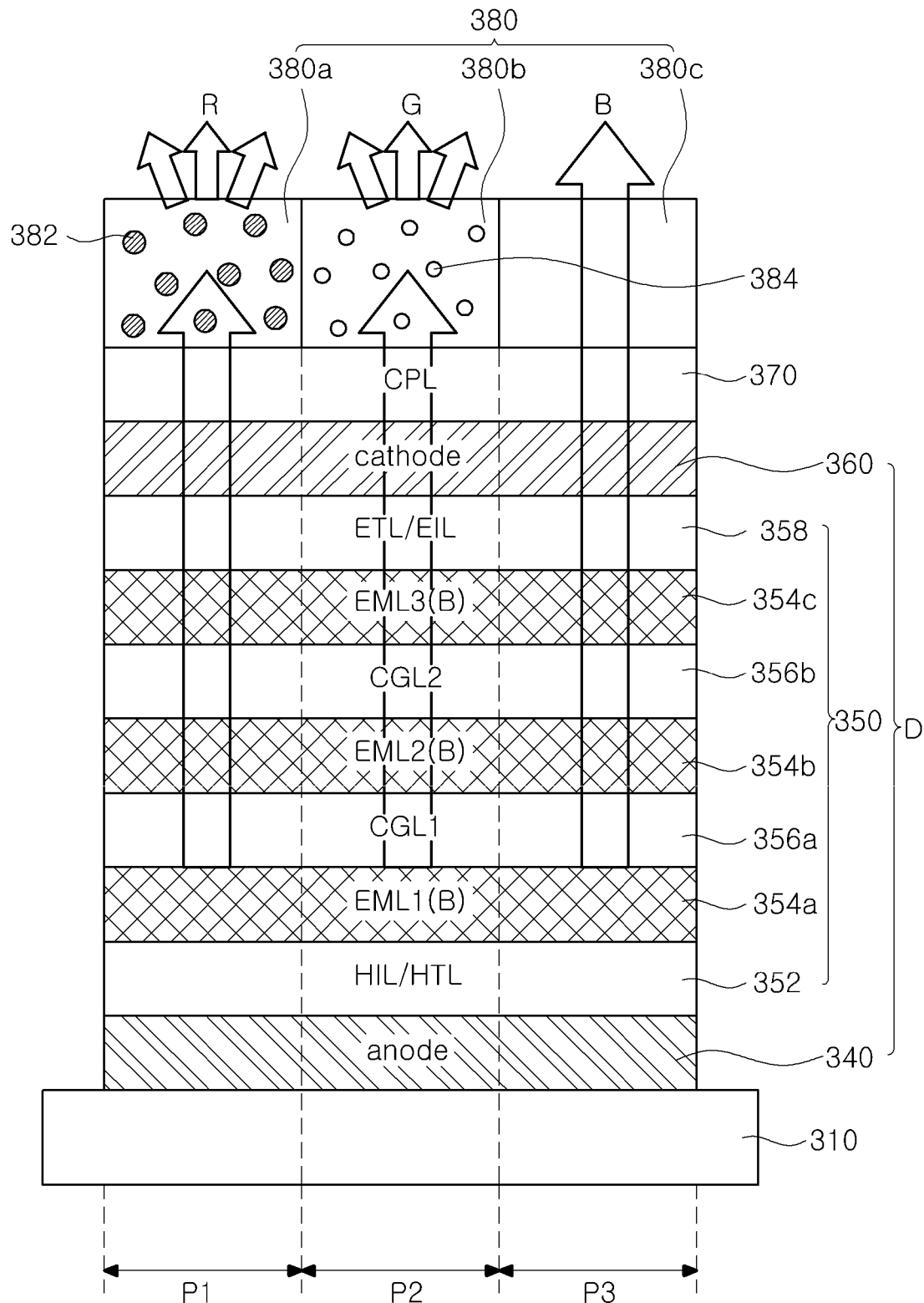
FIG. 8 is a schematic cross-sectional view of an organic light emitting diode display device according to a third embodiment of the present disclosure.

FIG. 8 is a schematic cross-sectional view of an organic light emitting diode display device according to a third embodiment of the present disclosure and shows a pixel. However, the organic light emitting diode display device of FIG. 8 obviously includes a plurality of pixels or pixel regions.

In FIG. 8, first, second and third pixel regions P1, P2 and P3 are defined on a substrate 310. A light emitting diode D is disposed in each pixel region P1, P2 and P3. The first, second and third pixel regions P1, P2 and P3 correspond to red, green and blue sub pixels, respectively.

The light emitting diode D includes a first electrode 340, a light emitting layer 350 and a second electrode 360. The light emitting layer 350 includes a hole auxiliary layer 352, a first light emitting material layer 354a, a first charge generation layer 356a, a second light emitting material layer 354b, a second charge generation layer 356b, a third light emitting material layer 354c, and an electron auxiliary layer 358.

More particularly, the first electrode 340 is formed in each of the first, second and third pixel regions P1, P2 and P3 as an anode. In the figure, although the first electrodes 340 in the first, second and third pixel regions P1, P2 and P3 are connected to each other, the first electrodes 340 in the first, second and third pixel regions P1, P2 and P3 are separated from each other.

The first electrode 340 can be formed of a transparent conductive material such as indium tin oxide (ITO) and indium zinc oxide (IZO). In addition, a reflection electrode or a reflection layer can be further formed under the first electrode 140. For example, the reflection electrode or the reflection layer can be formed of aluminum-palladium-copper (APC) alloy.

Meanwhile, the first electrode 340 can include a reflection electrode, and in this case, the first electrode 140 can have a triple-layered structure of ITO/APC/ITO.

The hole auxiliary layer 352 is formed on the first electrode 340 in each of the first, second and third pixel regions P1, P2 and P3. The hole auxiliary layer 352 can include at least one of a hole injecting layer (HIL) and a hole transporting layer (HTL). Here, the hole auxiliary layers 352 in the first, second and third pixel regions P1, P2 and P3 are formed of the same material, have the same structure and have the same thickness.

The hole auxiliary layer 352 in one pixel region P1, P2 and P3 can be connected to another hole auxiliary layer 352 in a next pixel region P1, P2 and P3 to form one body. Alternatively, the hole auxiliary layer 352 can be separated by the first, second and third pixel regions P1, P2 and P3.

The hole auxiliary layer 352 can be formed through a vacuum evaporation process. Alternatively, the hole auxiliary layer 352 can be formed through a soluble process.

The first light emitting material layer 354a is formed on the hole auxiliary layer 352 in each of the first, second and third pixel regions P1, P2 and P3. The first light emitting material layer 354a includes a blue light emitting material emitting blue light.

The first light emitting material layer 354a in one pixel region P1, P2 and P3 can be connected to another first light emitting material layer 354a in a next pixel region P1, P2 and P3 to form one body. Alternatively, the first light emitting material layer 354a can be separated by the first, second and third pixel regions P1, P2 and P3.

The first light emitting material layer 354a can be formed through a vacuum evaporation process. At this time, the first light emitting material layer 354a can include an anthracene derivative, a benzofluorene derivative, or an iridium (Ir) derivative as a dopant, but is not limited to this. Here, Firpic can be used as the Ir derivative.

Alternatively, the first light emitting material layer 354a can be formed through a soluble process. At this time, the first light emitting material layer 354a can include poly(N-vinylcarbazole), polyphenylphenyl dendron, or conjugated triphenylene polymers as a dopant, but is not limited to this.

The first charge generation layer (CGL1) 356a is formed on the first light emitting material layer 354a in each of the first, second and third pixel regions P1, P2 and P3.

The first charge generation layer 356a generates and provides electrons and holes. The first charge generation layer 356a can have a PN junction structure in which an N-type charge generation layer and a p-type charge generation layer are bonded. At this time, the N-type charge generation layer of the first charge generation layer 356a is disposed over the first light emitting material layer 354a and the P-type charge generation layer.

Meanwhile, a metal layer can be further formed between the N-type charge generation layer and the P-type charge generation layer of the first charge generation layer 356a. Preferably, the metal layer of the first charge generation layer 356a has a thickness of 4 nm or less. For example, the metal layer can be formed of aluminum (Al) or silver (Ag), but is not limited to this.

The first charge generation layer 356a can be formed through a vacuum evaporation process. At this time, the N-type charge generation layer of the first charge generation layer 356a can have a single layer structure of an electron transporting material doped with an electron injecting material or a double layer structure in which an electron injecting material and an electron transporting material are sequentially stacked, but is not limited to this. The P-type charge generation layer of the first charge generation layer 356a can have a single layer structure of a hole transporting material doped with a hole injecting material or a double layer structure in which a hole transporting material and a hole injecting material are sequentially stacked, but is not limited to this. For example, LiF, CsCO3, NaF, Ca, Ba, Na, Li, LiQ and the like can be used as the electron injecting material, and BPhen, TPBi, B3PyPB, BCP and the like can be used as the electron transporting material, but are not limited to this. In addition, TAPC, TCTA, NPB, NPD and the like can be used as the hole transporting material, and MoO3, WO3, V2O5, ReO3, HATCN, F4TCNQ and the like can be used as the hole injecting material, but are not limited to this.

Alternatively, the first charge generation layer 356a can be formed through a soluble process. At this time, PEDOT:PSS, PMA/TFB, WO3/PEDOT:PSS and the like can be used as the first charge generation layer 356a.

The second light emitting material layer 354b is formed on the first charge generation layer 356a in each of the first, second and third pixel regions P1, P2 and P3. The second light emitting material layer 354b is formed of a blue light emitting material emitting blue light.

The second light emitting material layer 354b in one pixel region P1, P2 and P3 can be connected to another second light emitting material layer 354b in a next pixel region P1, P2 and P3 to form one body. Alternatively, the second light emitting material layer 354b can be separated by the first, second and third pixel regions P1, P2 and P3.

The second light emitting material layer 354b can be formed through a vacuum evaporation process. At this time, the second light emitting material layer 354b can include an anthracene derivative, a benzofluorene derivative, or an iridium (Ir) derivative as a dopant, but is not limited to this. Here, Firpic can be used as the Ir derivative.

A thickness of the second light emitting material layer 354b is equal to or smaller than a thickness of the first light emitting material layer 354a. For example, the thickness of the first light emitting material layer 354a can be 20 nm to 60 nm, and the thickness of the second light emitting material layer 354b can be 20 nm to 30 nm, but is not limited to this.

In the meantime, a buffer layer can be further formed between the first light emitting material layer 354a and the first charge generation layer 356a or between the first charge generation layer 356a and the second light emitting material layer 354b. The buffer layer is formed through a vacuum evaporation process and increases the mobility of charges at an interface between a layer formed through a soluble process and a layer through a vacuum evaporation process.

Accordingly, when the first light emitting material layer 354a is formed through the soluble process and the first charge generation layer 356a is formed through the vacuum evaporation process, the buffer layer is disposed between the first light emitting material layer 154a and the first charge generation layer 356a.

Alternatively, when the first light emitting material layer 354a and the first charge generation layer 356a are formed through the soluble process, the buffer layer is disposed between the first charge generation layer 356a and the second light emitting material layer 354b, which is formed through the vacuum evaporation process.

The buffer layer can be formed of a bipolar compound, and the bipolar compound can be a monomolecular material having both electron properties and hole properties. More specifically, the bipolar compound is a material in which an electron-affinity core and a hole-affinity core are synthesized as a compound. For example, the bipolar compound can include an arylamine group and one of a heteroaryl group, a silicon group having an aromatic substituent and a sulfonyl group in a molecule, but is not limited to this.

The buffer layer has a relatively thin thickness of 1 nm to 5 nm, and beneficially, 1 nm to 3 nm.

In addition, an electron transporting layer can be further formed between the first light emitting material layer 354a and the first charge generation layer 356a, and a hole transporting layer can be further formed between the first charge generation layer 356a and the second light emitting material layer 354b.

At this time, the electron transporting layer and the first charge generation layer 356a can be formed through a vacuum evaporation process, and the buffer layer can be formed between the first light emitting material layer 354a formed through the soluble process and the electron transporting layer.

The second charge generation layer (CGL2) 356b is formed on the second light emitting material layer 354b in each of the first, second and third pixel regions P1, P2 and P3.

The second charge generation layer 356b generates and provides electrons and holes. The second charge generation layer 356b can have a PN junction structure in which an N-type charge generation layer and a p-type charge generation layer are bonded. At this time, the N-type charge generation layer of the second charge generation layer 356b is disposed over the second light emitting material layer 354b and the P-type charge generation layer.

Meanwhile, a metal layer can be further formed between the N-type charge generation layer and the P-type charge generation layer of the second charge generation layer 356b. Preferably, the metal layer of the second charge generation layer 356b has a thickness of 4 nm or less. For example, the metal layer can be formed of aluminum (Al) or silver (Ag), but is not limited to this.

The second charge generation layer 356b can be formed through a vacuum evaporation process. At this time, the N-type charge generation layer of the second charge generation layer 356b can have a single layer structure of an electron transporting material doped with an electron injecting material or a double layer structure in which an electron injecting material and an electron transporting material are sequentially stacked, but is not limited to this. The P-type charge generation layer of the second charge generation layer 356b can have a single layer structure of a hole transporting material doped with a hole injecting material or a double layer structure in which a hole transporting material and a hole injecting material are sequentially stacked, but is not limited to this. For example, LiF, CsCO3, NaF, Ca, Ba, Na, Li, LiQ and the like can be used as the electron injecting material, and BPhen, TPBi, B3PyPB, BCP and the like can be used as the electron transporting material, but are not limited to this. In addition, TAPC, TCTA, NPB, NPD and the like can be used as the hole transporting material, and MoO3, WO3, V2O5, ReO3, HATCN, F4TCNQ and the like can be used as the hole injecting material, but are not limited to this.

The third light emitting material layer 354c is formed on the second charge generation layer 356b in each of the first, second and third pixel regions P1, P2 and P3. The third light emitting material layer 354c is formed of a blue light emitting material emitting blue light.

The third light emitting material layer 354c in one pixel region P1, P2 and P3 can be connected to another third light emitting material layer 354c in a next pixel region P1, P2 and P3 to form one body. Alternatively, the third light emitting material layer 354c can be separated by the first, second and third pixel regions P1, P2 and P3.

The third light emitting material layer 354c can be formed through a vacuum evaporation process. At this time, the third light emitting material layer 354c can include an anthracene derivative, a benzofluorene derivative, or an iridium (Ir) derivative as a dopant, but is not limited to this. Here, Firpic can be used as the Ir derivative.

A thickness of the third light emitting material layer 354c is equal to or smaller than the thickness of the second light emitting material layer 354b. For example, the thickness of the third light emitting material layer 354c can be 20 nm to 30 nm, but is not limited to this.

The electron auxiliary layer 358 is formed on the third light emitting material layer 354c in each of the first, second and third pixel regions P1, P2 and P3. The electron auxiliary layer 358 can include at least one of an electron transporting layer and an electron auxiliary layer.

The electron auxiliary layer 358 in one pixel region P1, P2 and P3 can be connected to another electron auxiliary layer 358 in a next pixel region P1, P2 and P3 to form one body. Alternatively, the electron auxiliary layer 358 can be separated by the first, second and third pixel regions P1, P2 and P3.

The electron auxiliary layer 358 can be formed through a vacuum evaporation process.

The second electrode 360 is formed on the electron auxiliary layer 358 in each of the first, second and third pixel regions P1, P2 and P3 as a cathode. The second electrode 360 in one pixel region P1, P2 and P3 can be connected to another second electrode 360 in a next pixel region P1, P2 and P3 to form one body. The second electrode 360 can be formed over substantially all of the substrate 310.

The second electrode 360 can be formed of a conductive material having relatively low work function. For example, the second electrode 360 can be formed of aluminum (Al), magnesium (Mg), silver (Ag) or their alloy, but is not limited to this.

Here, light emitted from the first, second and third light emitting material layers 354a, 354b and 354c is outputted to the outside through the second electrode 360. The second electrode 360 can have a relatively thin thickness such that the light emitted from the first, second and third light emitting material layers 354a, 354b and 354c passes therethrough.

As mentioned above, the first electrode 340, the light emitting layer 350 and the second electrode 360 constitute the light emitting diode D.

Meanwhile, a capping layer 370 is formed on the second electrode 360. The capping layer 370 can be formed over substantially all of the substrate 310 like the second electrode 360. The capping layer 370 can be formed of an organic material having a relatively high refractive index. At this time, the wavelength of light moving along the capping layer 370 is amplified by surface plasma resonance, and thus the intensity of the peak is increased, thereby improving the light efficiency in the top emission type organic light emitting diode display device.

The capping layer 370 can be omitted.

Next, an encapsulation layer 380 is formed on the capping layer 370. The encapsulation layer 380 protects the light emitting diode D by blocking moisture or oxygen from the outside. The encapsulation layer 380 can be formed of a polymer functioning as an absorber or a buffer.

Here, a single layer including an inorganic layer or multiple layers including inorganic and organic layers can be further formed between the capping layer 370 and the encapsulation layer 380.

In the meantime, the encapsulation layer 380 includes first, second and third portions 380a, 380b and 380c corresponding to the first, second and third pixel regions P1, P2 and P3, respectively. The first portion 380a includes a first color changing material 382, the second portion 380b includes a second color changing material 384, and the third portion 380c does not include any color changing material.

The first color changing material 382 in the first portion 380a absorbs blue light and emits red light, and the second color changing material 384 in the second portion 380b absorbs blue light and emits green light.

The first and second color changing materials 382 and 384 can be quantum dots. At this time, the first and second color changing materials 382 and 384 can have different sizes.

Each quantum dot includes a core, and it is beneficial that a size of the core is 2 nm to 10 nm. The quantum dot can include only the core. Alternatively, the quantum dot can include a core and a shell or a core and first and second shells, but is not limited to this.

The quantum dot can be formed of PbS, PbSe, CdSe, CdS, InAs, or InP, but is not limited to this.

For example, the encapsulation layer 380 of the present disclosure can be formed by printing an adhesive polymer including the color changing materials 382 and 384 in a liquid phase or laminating a film including the color changing materials 382 and 384.

In the organic light emitting diode display device according to the third embodiment of the present disclosure, blue light emitted from the first, second and third light emitting material layers 354a, 354b and 354c is outputted to the outside through the second electrode 360. That is, the organic light emitting diode display device according to the second embodiment of the present disclosure is a top emission type.

At this time, while passing through the encapsulation layer 380, the blue light emitted from the first, second and third light emitting material layers 354a, 354b and 354c is changed into red light R to be outputted in the first pixel region P1, is changed into green light G to be outputted in the second pixel region P2, and is outputted without a change in the third pixel region P3.

More particularly, in the first pixel region P1, the first color changing material 382 in the first portion 380a of the encapsulation layer 380 absorbs the blue light emitted from the first, second and third light emitting material layers 354a, 354b and 354c and emits the red light R. In the second pixel region P2, the second color changing material 384 in the second portion 380b of the encapsulation layer 380 absorbs the blue light emitted from the first, second and third light emitting material layers 354a, 354b and 354c and emits the green light G. On the other hand, in the third pixel region P3, since the third portion 380c of the encapsulation layer 380 does not include any color changing material, the blue light emitted from the first, second and third light emitting material layers 354a, 354b and 354c passes through the third portion 380c as it is.

Meanwhile, the microcavity effect can be applied to the organic light emitting diode display device according to the third embodiment of the present disclosure in order to increase the color purity. At this time, the first light emitting material layer 354a can be formed in a position satisfying the first order cavity condition, the second light emitting material layer 354b can be formed in a position satisfying the second order cavity condition, and the third light emitting material layer 354c can be formed in a position satisfying the third order cavity condition.

As described above, in the organic light emitting diode display device according to the third embodiment of the present disclosure, the red, green and blue light R, G and B is outputted by using the color changing materials 382 and 384 such as the quantum dot. Thus, the color purity can be increased, and the light efficiency can be improved. At this time, the color purity can be further increased by applying the microcavity effect.

The color changing materials 382 and 384 scatter light such that light is emitted in a direction other than the front direction, and thus the viewing angle can be improved.

In addition, since the first, second and third light emitting material layers 354a, 354b and 354c emitting single color light, i.e., blue light are used for the first, second and third pixel regions P1, P2 and P3, the luminous efficiencies and lifetimes can be uniform in the first, second and third pixel regions P1, P2 and P3.

Moreover, since the light emitting material layers 354a, 354b and 354c are formed as a stack structure of three layers, the driving voltage can be further reduced, and the luminous efficiency and the lifetime can be further improved as compared with the first embodiment.

Although the top emission type is described in the third embodiment of the present disclosure, the third embodiment of the present disclosure can be applied to the bottom emission type.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. An organic light emitting diode display device, comprising:
    a substrate on which first, second and third pixel regions are defined;
    a first electrode in each of the first, second and third pixel regions on a first surface of the substrate;
    a hole auxiliary layer on the first electrode;
    a first light emitting material layer on the hole auxiliary layer and emitting first light;
    an electron auxiliary layer on the first light emitting material layer;
    a second electrode on the electron auxiliary layer;
    a capping layer on the second electrode;
    an encapsulation layer on the capping layer;
    a color changing layer under the first electrode;
    a first charge generation layer and a second light emitting material layer between the first light emitting material layer and the electron auxiliary layer; and
    wherein the first, second and third pixel regions include the first and second light emitting material layers emitting blue light as the first light,
    wherein the first charge generation layer is disposed between the first light emitting material layer and the second light emitting material layer,
    wherein the first charge generation layer directly contacts both the first light emitting material layer and the second light emitting material layer, wherein the color changing layer includes first, second and third portions corresponding to the first, second and third pixel regions, respectively, the second portion being in contact with at least one of the first portion and the third portion, wherein the first portion and the second portion include different quantum dot materials each having a core and a shell, and the third portion does not include a quantum dot material, wherein the first portion absorbs the first light and outputs second light, the second portion absorbs the first light and outputs third light, and the third portion passes the first light as is, wherein the color changing layer is disposed directly on a second surface of the substrate opposite the first surface to realize bottom emission, wherein the first electrode and the substrate are disposed between the color changing layer and the second electrode, and the substrate is disposed between the color changing layer and the first electrode, wherein the capping layer is disposed between the second electrode and the encapsulation layer, wherein the second electrode is formed of aluminum, magnesium, silver or an alloy thereof, and wherein a thickness of the encapsulation layer is larger than a thickness of the capping layer.

2. The organic light emitting diode display device of claim 1, wherein the first portion includes a first color changing material, the second portion includes a second color changing material, and the first and second color changing materials are the quantum dot materials.

3. The organic light emitting diode display device of claim 1, wherein a thickness of the second light emitting material layer is equal to or smaller than a thickness of the first light emitting material layer.

4. The organic light emitting diode display device of claim 3, further comprising:
a second charge generation layer and a third light emitting material layer between the second light emitting material layer and the electron auxiliary layer,
wherein the third light emitting material layer emits light having a same wavelength as the first light.

5. The organic light emitting diode display device of claim 4, wherein a thickness of the third light emitting material layer is equal to or smaller than the thickness of the second light emitting material layer.

6. The organic light emitting diode display device of claim 1, wherein the second light is red light, and the third light is green light.

7. The organic light emitting diode display device of claim 1, wherein the color changing layer includes an adhesive polymer.

8. The organic light emitting diode display device of claim 1, wherein the color changing layer has continuous first, second and third portions to block moisture or oxygen from outside.

9. The organic light emitting diode display device of claim 1, wherein the second portion is in contact with the first portion and the third portion.

10. The organic light emitting diode display device of claim 1, wherein the first portion includes a first color changing material, the second portion includes a second color changing material, and the first and second color changing materials have different sizes.

11. The organic light emitting diode display device of claim 10, wherein the second color changing material has a smaller size than the first color changing material.

12. The organic light emitting diode display device of claim 1, wherein the first light emitting material layer is formed in a position satisfying a first order cavity condition and the second light emitting material layer is formed in a position satisfying a second order cavity condition of a microcavity effect.

13. The organic light emitting diode display device of claim 1, wherein the thickness of the second light emitting material layer is about 20 nm to 30 nm and the thickness of the first light emitting material layer is about 20 nm to 60 nm.

14. The organic light emitting diode display device of claim 1, wherein the organic light emitting diode display device is a bottom emission type in which light emitted from the first and second light emitting material layers is outputted to outside through the first electrode.

15. The organic light emitting diode display device of claim 1, wherein the color changing layer is located further from the first electrode than the substrate.

* * * * *